(12) United States Patent
Malcolm et al.

(10) Patent No.: US 10,069,279 B2
(45) Date of Patent: Sep. 4, 2018

(54) SELF MODE-LOCKING SEMICONDUCTOR DISK LASER (SDL)

(71) Applicant: SOLUS TECHNOLOGIES LIMITED, Glasgow, Central Scotland (GB)

(72) Inventors: Graeme Peter Alexander Malcolm, Central Scotland (GB); Craig James Hamilton, Central Scotland (GB)

(73) Assignee: SOLUS TECHNOLOGIES LIMITED, Glasgow (GB)

( * ) Notice: Subject to any disclaimer, the term of this patent is extended or adjusted under 35 U.S.C. 154(b) by 7 days.

(21) Appl. No.: 15/103,358

(22) PCT Filed: Dec. 10, 2014

(86) PCT No.: PCT/GB2014/053658
§ 371 (c)(1),
(2) Date: Jun. 10, 2016

(87) PCT Pub. No.: WO2015/087072
PCT Pub. Date: Jun. 18, 2015

(65) Prior Publication Data
US 2016/0322786 A1   Nov. 3, 2016

(30) Foreign Application Priority Data

Dec. 10, 2013 (GB) .................................. 1321800.3

(51) Int. Cl.
*H01S 3/098* (2006.01)
*H01S 5/14* (2006.01)
(Continued)

(52) U.S. Cl.
CPC ............ *H01S 5/141* (2013.01); *H01S 3/0816* (2013.01); *H01S 3/08059* (2013.01);
(Continued)

(58) Field of Classification Search
CPC .... H01S 5/141; H01S 5/02476; H01S 5/0657; H01S 5/125; H01S 5/14; H01S 5/34;
(Continued)

(56) References Cited

U.S. PATENT DOCUMENTS

| 5,079,772 A | 1/1992 | Negus et al. |
| 5,627,854 A | 5/1997 | Knox |

(Continued)

FOREIGN PATENT DOCUMENTS

| GB | 2493583 A | 2/2013 |
| GB | 2500676 A | 10/2013 |

(Continued)

OTHER PUBLICATIONS

Svelto, Orazio "Principle of Laser" 2010 Springer 5th Edition pp. 1-620.*

(Continued)

*Primary Examiner* — Tod T Van Roy
*Assistant Examiner* — Delma R Forde
(74) *Attorney, Agent, or Firm* — FisherBroyles, LLP

(57) ABSTRACT

A self mode locking laser and corresponding method is described. The laser comprises a resonator (2) terminated by first (3) and second (4) mirrors and folded by a third mirror (5). The third mirror comprises a reflector (15) surmounted by a multilayer semiconductor gain medium (16) that includes at least one quantum well layer and an optical Kerr lensing layer (20). A perturbator is also included that provides a means to induce a perturbation on an intensity of one or more cavity modes of the resonator. The pertubator is employed to induce a small perturbation on the intensity of the cavity modes of the resonator which is sufficient for the optical Kerr lensing layer to induce mode locking on the output field. The second mirror (4) comprises an intensity saturable mirror that provides a means for reducing the pulse (Continued)

widths of the generated output field e.g. to around 100 fs. A diamond heat spreader (20) is attached to the top of the half VCSEL gain medium (13) for improved cooling as well as representing the Kerr medium. Further folding mirrors (6-8) may be inserted to adjust the degree of astigmatism to be compensated for by the Kerr effect used for mode-locking.

38 Claims, 6 Drawing Sheets

(51) Int. Cl.
*H01S 3/08* (2006.01)
*H01S 3/11* (2006.01)
*H01S 5/065* (2006.01)
*H01S 5/125* (2006.01)
*H01S 5/34* (2006.01)
H01S 3/081 (2006.01)
H01S 3/094 (2006.01)
H01S 3/0941 (2006.01)
H01S 5/024 (2006.01)
H01S 5/04 (2006.01)
H01S 5/183 (2006.01)

(52) U.S. Cl.
CPC .......... *H01S 3/1112* (2013.01); *H01S 3/1118* (2013.01); *H01S 5/02476* (2013.01); *H01S 5/0657* (2013.01); *H01S 5/125* (2013.01); *H01S 5/14* (2013.01); *H01S 5/34* (2013.01); *H01S 3/0813* (2013.01); *H01S 3/09415* (2013.01); *H01S 3/094053* (2013.01); *H01S 5/02415* (2013.01); *H01S 5/02484* (2013.01); *H01S 5/041* (2013.01); *H01S 5/18383* (2013.01); *H01S 2301/02* (2013.01)

(58) Field of Classification Search
CPC .............. H01S 5/0658; H01S 5/02415; H01S 5/02484; H01S 5/041; H01S 5/18383; H01S 2301/02; H01S 3/08059; H01S 3/0816; H01S 3/1112; H01S 3/1118; H01S 3/0813; H01S 3/094053; H01S 3/09415

See application file for complete search history.

(56) References Cited

U.S. PATENT DOCUMENTS

| | | | |
|---|---|---|---|
| 5,966,390 | A | 10/1999 | Stingl et al. |
| 6,735,234 | B1 | 5/2004 | Paschotta et al. |
| 6,834,064 | B1 | 12/2004 | Paschotta et al. |
| 9,318,867 | B2 * | 4/2016 | Pronin .................. H01S 3/0813 |
| 2002/0085608 | A1 | 7/2002 | Kopf et al. |
| 2003/0039025 | A1 | 2/2003 | Mugino et al. |
| 2004/0095634 | A1 | 5/2004 | Paschotta et al. |
| 2004/0190567 | A1 | 9/2004 | Lutgen et al. |
| 2007/0098031 | A1 | 5/2007 | Yang et al. |
| 2007/0223540 | A1 | 9/2007 | Sudmeyer et al. |
| 2008/0013587 | A1* | 1/2008 | Tempea ................ H01S 3/1112 372/93 |
| 2008/0043798 | A1 | 2/2008 | Calvez et al. |
| 2009/0290606 | A1 | 11/2009 | Chilla et al. |
| 2010/0303121 | A1 | 12/2010 | Alalusi et al. |
| 2011/0150013 | A1 | 6/2011 | Spinelli et al. |
| 2011/0292954 | A1 | 12/2011 | Stoev et al. |
| 2012/0093179 | A1 | 4/2012 | Dunn et al. |
| 2012/0200912 | A1* | 8/2012 | Hodgson ............... H01S 3/0057 359/330 |
| 2013/0064262 | A1 | 3/2013 | Kopf |
| 2014/0286364 | A1 | 9/2014 | Pronin et al. |
| 2015/0063389 | A1 | 3/2015 | Hamilton et al. |
| 2016/0254645 | A1* | 9/2016 | Hamilton ............... H01S 3/1118 372/18 |

FOREIGN PATENT DOCUMENTS

| | | | |
|---|---|---|---|
| WO | WO 01/59895 | A1 | 8/2001 |
| WO | WO 2007/053336 | A1 | 5/2007 |
| WO | WO 2011/084467 | A1 | 7/2011 |
| WO | WO 2013/003239 | A1 | 1/2013 |
| WO | WO2013144619 | | * 10/2013 |
| WO | WO2013144620 | | * 10/2013 |
| WO | WO2015087072 | | * 6/2015 |

OTHER PUBLICATIONS

Dec. 3, 2015 Office Action issued in U.S. Appl. No. 14/389,212.
Feb. 18, 2015 Office Action issued in U.S. Appl. No. 14/389,212.
Härkonen et al., "Modelocked GaSb Disk Laser Producing 384 fs Pulses at 2 µm Wavelength," Electronic Letters, vol. 47, No. 7, Jan. 1, 2011, p. 454 (XP055070624).
Hayduk, "Passively Mode-Locked Erbium-Doped Fiber Lasers Using Multiple Quantum Well Saturable Absorbers," Mar. 1998, Air Force Research Laboratory, pp. 1-133.
Jul. 20, 2016 Notice of Allowance issued in U.S. Appl. No. 14/389,247.
Jun. 24, 2016 Office Action issued in U.S. Appl. No. 14/389,212.
Keller et al., "Passively Modelocked Surface-Emitting Semiconductor Lasers," Physics Reports, vol. 429, No. 2, Jun. 1, 2006, pp. 67-120 (XP024926285).
Kornaszewski et al., "SESAM-Free Mode-Locked Semiconductor Disk Laser," Laser & Photonics Reviews, vol. 6, No. 6, Aug. 27, 2012, pp. 23-23 (XP055070226).
Mar. 16, 2015 Office Action issued in U.S. Appl. No. 14/389,247.
Oct. 21, 2015 Office Action issued in U.S. Appl. No. 14/389,247.
Pronin et al., "High-power 200 fs Kerr-lens mode-locked Yb:YAG thin-disk oscillator," Optics Letter, Optical Society of America, vol. 36, No. 24, Dec. 15, 2011, pp. 4746-4748 (XP001571558).
Saarinen et al., "Power-Scalable 157 µm Mode-Locked Semiconductor Disk Laser Using Wafer Fusion," Optics Letters, vol. 34, No. 20, Oct. 7, 2009, p. 3139 (XP055070616).
Saas et al., "Exciton resonance tuning for the generation of subpicosecond pulses from a mode-locked semiconductor disk laser," Applied Physics Letters, 89/141107 (2006).
Trooper et al., "Topical Review: Vertical-external-cavity semiconductor lasers," Journal of Physics D: Applied Physics, vol. 37, No. 9, May 7, 2004, pp. R75-R85.
Zhao et al., "Subpicosecond pulse generation from a 1.56 µm mode-locked VECSEL," Optics Letters, vol. 36, No. 22, Nov. 15, 2011, pp. 4377-4379. (XP001570805).
Jun. 1, 2017 Office Action issued in U.S. Appl. No. 15/032,405.
Sieber et al., "Femtosecond VECSEL with tunable multi-gigahertz repetition rate," Optics Express, vol. 19, No. 23, Published Nov. 3, 2011.
Rattunde et al., 'III-Sb-based Type-I QW Diode Lasers.' Mid-infrared Semiconductor Optoelectronics. Eds. Anthony Krier. Springer Series in Optical Sciences, vol. 118, London: Springer, 2006, pp. 140-142 (ISBN: 184628208X).
Svelto, "Priciples of Lasers," 2010, Springer 5th Edition, pp. 354-355.

* cited by examiner

SELF MODE-LOCKING SEMICONDUCTOR DISK LASER (SDL)

This application is the U.S. national phase of International Application No. PCT/GB2014/053658 filed 10 Dec. 2014 which designated the U.S. and claims priority to GB Patent Application No. 1321800.3 filed 10 Dec. 2013, the entire contents of each of which are hereby incorporated by reference.

The present invention relates to the field of semiconductor lasers and in particular to a semiconductor disc laser (SDL) configured to emit ultra short pulses of radiation.

It is noted that SDLs are also known in the art as Vertical External Cavity Emitting Lasers (VECSELs) or Optically Pumped Semiconductor Lasers (OPSLs). Therefore the term semiconductor disc laser (SDL) when used throughout the present description is used to refer to each of these systems.

The term "ultra short" pulses as used within the following description refers to pulses having a duration from about 100 picoseconds (ps) down to a few femtoseconds (fs).

Ultra short pulses of optical radiation generated by laser sources are employed in a range of scientific, instrumentation and nonlinear optics applications. A well-known technique for generating short or ultra short pulse generation is mode locking. When mode locking takes place in a laser resonator a plurality of modes of the laser resonator are coupled in a phase-locked manner in such a way that the resulting generated electromagnetic field comprises a short pulse or cavity mode which circulates within the resonator. It can be induced by a temporal loss modulation which reduces the intracavity losses for a pulse within each cavity roundtrip time. This results in an open net gain window, in which pulses only experience gain if they pass the modulator within a particular time window.

The loss modulation can be formed either actively or passively. Active mode locking is achieved, for instance, using an acousto-optic modulator as an intracavity element, which is synchronised to the cavity roundtrip time. However, ultra short pulse generation relies on passive mode-locking techniques, because only a passive shutter is fast enough to shape and stabilise ultra short pulses. Passive mode locking generally relies on a saturable absorber mechanism, which produces decreasing loss with increasing optical intensity. When the saturable absorber parameters are correctly adjusted for the laser system, stable and self-starting mode locking can be achieved.

It is known in the art to employ a saturable Bragg reflector (SBR) to passively mode lock a solid state laser, see for example Tsuda et al "*Mode-Locking Ultrafast Solid-State Lasers with Saturable Bragg Reflectors*", IEEE Journal of Selected Topics in Quantum Electronics Vol. 2, No. 3, September 1996 pp. 454-463 and U.S. Pat. No. 5,627,854. An SBR (also sometimes referred to as a SESAM®) is a nonlinear mirror that comprises one or more semiconductor quantum wells within a standard distributed Bragg reflector (DBR) i.e. a stack of alternating layers of quarter wave semiconductor materials. As result, the reflectivity, or absorption, exhibited by an SBR is intensity dependent i.e. the reflectivity is higher for higher light intensities. Femtosecond mode locking of resonators containing Ti:sapphire or Cr:LiCAF solid state gain mediums have been demonstrated employing these techniques.

US patent publication number 2004/0190567 extends the above concepts so as to mode lock an SDL by incorporating a saturable Bragg reflector (SBR) within the resonator. During operation, the described devices all start in a continuous wave operation. A "slight external disturbance" of the intracavity field intensity is then required in order to provide the initial perturbation necessary for mode locking to take place. One mechanism known in the art to achieve this initial perturbation is the introduction of a mechanical perturbation via one of the cavity mirrors e.g. the mirror is struck by the laser operator.

Alternative mode locking techniques are also known in the art wherein the saturable absorber mechanism is based on the optical Kerr effect. Examples of such devices are described previously by the present inventors within international patent publication numbers WO 2013/144619 and WO 2013/144620. Both of these documents describe self mode locking SDLs wherein the saturable absorber mechanism employed is an optical Kerr lensing layer located within the gain medium. Unlike the teachings of US patent publication number 2004/0190567, both systems are self mode locking since they both incorporate a means for inducing the required initial perturbation on the intracavity field intensity.

In WO 2013/144619 this is achieved by setting the length of the resonator such that a round trip time of the cavity mode corresponds with the upper-state lifetime of the semiconductor carriers located within the gain medium.

Alternatively, and as described in WO 2013/144620, an astigmatism controller may be employed to introduce astigmatism on the cavity mode at the gain medium. The resonator is then configured such that the optical Kerr lensing layer acts to compensate for this induced astigmatism of the cavity mode.

In a number of scientific, instrumentation and nonlinear optics applications it is often desirable to obtain the shortest available pulse widths. It is therefore recognised that it would be advantageous to provide a self-mode locking semiconductor disc laser system that exhibits output pulses having shorter pulse widths than those provided by the self-mode locking semiconductor disc laser systems known in the art.

SUMMARY OF INVENTION

According to a first aspect of the present invention there is provided a self mode locking laser the laser comprising:
  a resonator terminated by first and second mirrors and folded by a third mirror, the third mirror comprising a reflector surmounted by a multilayer semiconductor gain medium including at least one quantum well layer and an optical Kerr lensing layer,
  a perturbator that provides a means to induce a perturbation on an intensity of one or more cavity modes of the resonator,
  wherein the second mirror comprises an intensity saturable mirror.

The above configuration provides a laser which mode locks without requiring a dedicated passive or active mode locking elements to be incorporated therein. The pertubator is employed to induce a small perturbation on the intensity of the cavity modes of the resonator which is sufficient for the optical Kerr lensing layer to induce mode locking on the output field. The intensity saturable mirror provides a means for reducing the pulse widths of the generated output field e.g. to below 100 fs.

The pertubator may comprise an astigmatism controller that provides a means for introducing astigmatism to the one or more cavity modes at the gain medium. In this embodiment the resonator is preferably configured so the Kerr lensing layer acts to compensate for the astigmatism introduced to the cavity modes. By compensating for the astigmatism introduced to the cavity modes the area of overlap between the cavity modes and a pump spot at the gain medium is increased.

Alternatively, the pertubator may comprise selecting the length of the resonator so a round trip time of the cavity modes corresponds with an upper-state lifetime of one or more semiconductor carriers located within the gain medium.

Most preferably the optical Kerr lensing layer comprises a heat spreader mounted upon the semiconductor gain medium. The heat spreader may comprise a layer of diamond crystal.

The resonator may be additionally folded by a fourth mirror, the fourth mirror being located between the second and third mirrors. The fourth mirror preferably has a concave radius of curvature.

The resonator may be additionally folded by a fifth mirror, the fifth mirror being located between the second and fourth mirrors. The fifth mirror is preferably planar.

The resonator may be additionally folded by a sixth mirror, the sixth mirror being located between the second and fifth mirrors. The sixth mirror preferably has a concave radius of curvature.

Optionally the laser comprises a continuous wave (cw) optical field source the output from which is configured to pump the gain medium. The (cw) optical field source may comprise a fibre coupled laser diode system.

The astigmatism controller may comprise a mirror rotating means. The mirror rotating means may be employed to rotate the fourth mirror so as to vary the angle of incidence of the cavity modes upon the fourth mirror.

Preferably the gain medium is configured to generate the cavity modes at a predetermined wavelength $\lambda_0$ within a first resonant periodic gain etalon (RPG) feature.

The first mirror may be partially reflective and partially transmissive at the predetermined wavelength $\lambda_0$. The first mirror therefore acts as an output coupler for the resonator.

Most preferably the reflectivity profile of the second mirror is offset to a wavelength shorter than the predetermined wavelength $\lambda_0$ and configured to suppress gain within a second resonant periodic gain etalon (RPG) feature at a wavelength longer than the predetermined wavelength $\lambda_0$.

Offsetting the reflectivity profile of the second mirror to wavelength shorter than the predetermined wavelength $\lambda_0$ while suppressing gain within a second resonant periodic gain etalon (RPG) feature at a wavelength longer than the predetermined wavelength $\lambda_0$ provides a means for producing a more reliable mode-locked laser source that exhibits less noise when compared with those systems known in the art.

Most preferably the reflectivity profile of the second mirror is offset to a wavelength that is in the range of a half to one free spectral range of the resonant periodic gain etalon (RPG) feature.

The reflector may comprise a first distributed Bragg reflector (DBR).

Preferably the intensity saturable mirror comprises a saturable Bragg reflector (SBR) having a second distributed Bragg reflector (DBR) and one or more quantum well layers located within the second distributed Bragg reflector (DBR).

Most preferably the laser provides an output field comprising ultra short pulses. The ultra short pulses may have a pulse width in the range of 100 ps to 100 fs.

According to a second aspect of the present invention there is provided a method of self mode locking a laser the method comprising providing a resonator terminated by a first mirror and a second mirror comprising an intensity saturable mirror;
folding the resonator with a third mirror, the third mirror comprising a reflector surmounted by a multilayer semiconductor gain medium including at least one quantum well layer and an optical Kerr lensing layer;
inducing a perturbation on an intensity of one or more cavity modes of the resonator; and
employing the intensity saturable mirror to reduce the pulse width of the one or more cavity modes of the resonator.

Inducing a perturbation on the intensity of the intracavity field of the resonator may comprise introducing an astigmatism to the one or more cavity modes at the gain medium.

The method of self mode locking a laser may further comprise configuring the resonator so the Kerr lensing layer acts to compensate for the astigmatism introduced to the cavity modes. In this way an area of overlap between the cavity mode and a pump spot at the gain medium is increased.

Inducing a perturbation on the intensity of the one or more cavity modes of the resonator may comprise selecting a length of the resonator so a round trip time of the one or more cavity modes corresponds with an upper-state lifetime of one or more semiconductor carriers located within the gain medium.

The method of self mode locking a laser may further comprise folding the cavity by providing a fourth mirror between the second and third mirrors.

The astigmatism may be introduced to the cavity mode by rotating the fourth mirror so as to increase the angle of incidence of a resonating field upon the fourth mirror.

The method of self mode locking a laser may further comprise folding the cavity by providing a fifth mirror between the second and fourth mirrors.

The method of self mode locking a laser may further comprise folding the cavity by providing a sixth mirror between the second and fifth mirrors.

The method of self mode locking a laser may further comprise providing a continuous wave (cw) optical field configured to pump the gain medium.

The method of self mode locking may further comprise configuring the gain medium to generate the one or more cavity modes at a predetermined wavelength $\lambda_0$ within a first resonant periodic gain etalon (RPG) feature.

The method of self mode locking may further comprise offsetting the reflectivity profiles of the second mirror to a wavelength shorter than the predetermined wavelength $\lambda_0$.

The method of self mode locking may further comprise configuring the reflectivity profiles of the second mirror to suppress gain within a second resonant periodic gain etalon (RPG) feature at a wavelength longer than the predetermined wavelength $\lambda_0$.

Most preferably the reflectivity profile of the second mirror is offset to a wavelength that is in the range of a half to one free spectral range of the resonant periodic gain etalon (RPG) feature.

Embodiments of the second aspect of the invention may comprise features to implement the preferred or optional features of the first aspect of the invention or vice versa.

According to a third aspect of the present invention there is provided a self mode locking laser the laser comprising:
a resonator terminated by first and second mirrors and folded by a third mirror, the third mirror surmounted by a multilayer semiconductor gain medium including at least one quantum well layer and an optical Kerr lensing layer, an astigmatism controller that provides a means for introducing astigmatism to a cavity mode at the gain medium, wherein the resonator is configured so the Kerr lensing layer acts to compensate for the astigmatism introduced to the cavity mode, and the second mirror comprises an intensity saturable mirror.

Embodiments of the third aspect of the invention may comprise features to implement the preferred or optional features of the first or second aspects of the invention or vice versa.

According to a fourth aspect of the present invention there is provided a method of self mode locking a laser the method comprising:

providing a resonator terminated by a first mirror and a second mirror comprising an intensity saturable mirror;

folding the resonator with a third mirror, the third mirror comprising a reflector surmounted by a multilayer semiconductor gain medium including at least one quantum well layer and an optical Kerr lensing layer;

introducing an astigmatism to the one or more cavity modes at the gain medium;

configuring the resonator so the Kerr lensing layer acts to compensate for the astigmatism introduced to the cavity modes; and employing the intensity saturable mirror to reduce the pulse width of the one or more cavity modes of the resonator.

Embodiments of the fourth aspect of the invention may comprise features to implement the preferred or optional features of the first to third aspects of the invention or vice versa.

According to a fifth aspect of the present invention there is provided a self mode locking laser the laser comprising:

a resonator terminated by first and second mirrors and folded by a third mirror, the third mirror surmounted by a multilayer semiconductor gain medium including at least one quantum well layer and an optical Kerr lensing layer, wherein a length of the resonator is selected so a round trip time of a cavity mode corresponds with an upper-state lifetime of one or more semiconductor carriers located within the gain medium, and the second mirror comprises an intensity saturable mirror.

Embodiments of the fifth aspect of the invention may comprise features to implement the preferred or optional features of the first to fourth aspects of the invention or vice versa.

According to a sixth aspect of the present invention there is provided a method of self mode locking a laser the method comprising:

providing a resonator terminated by a first mirror and a second mirror comprising an intensity saturable mirror;

folding the resonator with a third mirror, the third mirror comprising a reflector surmounted by a multilayer semiconductor gain medium including at least one quantum well layer and an optical Kerr lensing layer;

selecting a length of the resonator so a round trip time of the one or more cavity modes corresponds with an upper-state lifetime of one or more semiconductor carriers located within the gain medium; and employing the intensity saturable mirror to reduce the pulse width of the one or more cavity modes of the resonator.

Embodiments of the sixth aspect of the invention may comprise features to implement the preferred or optional features of the first to fifth aspects of the invention or vice versa.

BRIEF DESCRIPTION OF DRAWINGS

There will now be described, by way of example only, various embodiments of the invention with reference to the drawings, of which.

Figure 1:
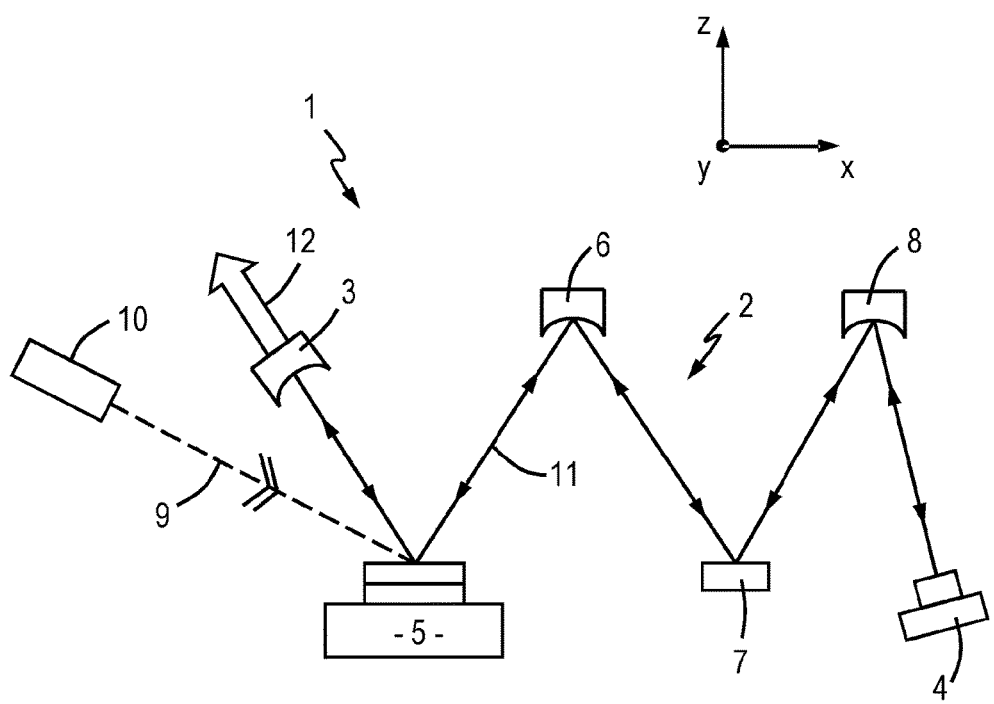
FIG. 1 presents a schematic representation of a self mode-locking, semiconductor disk laser (SDL) in accordance with an embodiment of the present invention.

In the description which follows, like parts are marked throughout the specification and drawings with the same reference numerals. The drawings are not necessarily to scale and the proportions of certain parts have been exaggerated to better illustrate details and features of embodiments of the invention.

DETAILED DESCRIPTION

Referring initially to FIG. 1, a schematic representation of a self mode-locking, semiconductor disk laser (SDL) 1 in accordance with an embodiment of the present invention is shown. For clarity of understanding axes are provided within this figure. The plane of the cavity referred to below is the plane defined by the x and z axes.

The self mode-locking laser 1 can be seen to comprise a laser-resonator 2 formed between a first 3 and a second mirror 4 and includes a multilayer, optically-pumped, semiconductor disk laser (SDL) 5 further details of which are provided below with reference to FIGS. 2 and 3. As can be seen the SDL 5 is arranged to function as a first folding mirror for the resonator 2. Three further folding mirrors 6, 7 and 8 are included within the resonator 2 and so the resonator 2 can be considered to be a four times folded resonator.

The three folding mirrors 6, 7 and 8, are arranged to be highly reflective at a central wavelength $\lambda_0$ of the SDL 5 (for ease of understanding this is chosen to be 980 nm) while the first mirror 3 is partially reflective and partially transmissive at this central wavelength and so acts as an output coupler for the resonator 2.

The mirrors 4, 6, 7 and 8 may be mounted within piezo-electric controlled mirror mounts so as to provide a means for fine adjusting the alignment of these components. Furthermore, mirrors 3, 6 and 8 are concave mirrors each having a radius of curvature of 200 mm while the mirrors 4 and 7 and the SDL 5 are substantially planar reflecting elements such that the resonator 2 is optically stable. Further discussion of the profile of the second mirror 4, and the implications this has to the stability of the resonator 2 is provided below. In the embodiment of FIG. 1 a spacing of 150 mm is provided between each of the adjacent mirrors 3, 5, 6, 7, 8 and 4 of the resonator 2.

A continuous wave (cw) optical pumping field 9 suitable for pumping the SDL 5 is provided by employing a fibre coupled laser diode system 10. In the presently described embodiment the fibre coupled laser diode system 10 is configured to generate a cw optical pumping field 9 at 808 nm. A DILAS® M1F4S22-808 30C-SS2.1 is an example of one such suitable fibre coupled laser diode system 10.

As can be seen from FIG. 1, the fibre coupled laser diode system 10 is arranged to pump the gain medium 16 at an angle suitable for providing an elliptical pump spot at the surface of the gain medium 16. It will be appreciated by the skilled reader that the present invention is not so limited and that the fibre coupled laser diode system 10 could provide a pump field 9 that is perpendicular to the SDL 5 so as to provide a circular pump spot at the surface of the gain medium 16.

In FIG. 1 the intra cavity resonating field is depicted generally by reference numeral 11 while the ultra short pulsed output field from the laser resonator 2 is depicted generally by reference numeral 12.

Figure 2:
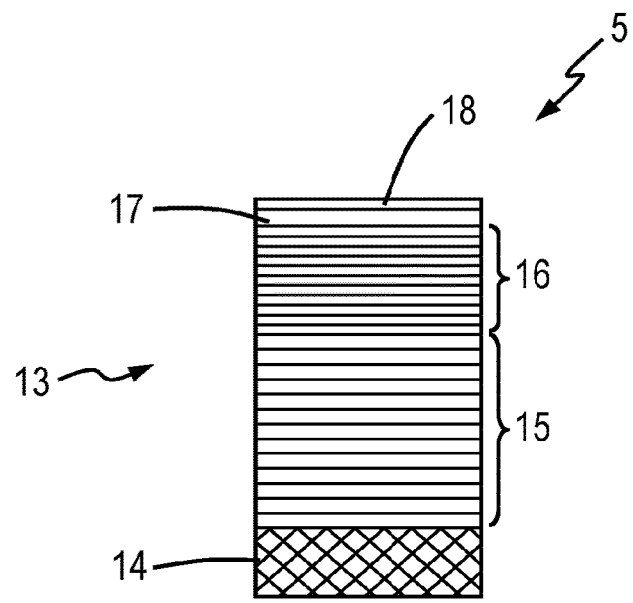
FIG. 2 presents a schematic representation of a semiconductor disk laser (SDL) employed by the laser of FIG. 1.

A schematic representation of the SDL 5 is presented in FIG. 2. The SDL 5 can be seen to comprise a wafer structure 13 that is grown by a metal-organic chemical vapour deposition (MOCVD) technique on a GaAs substrate 14. The deposition of the wafer structure may be achieved by alternative techniques known in the art e.g. molecular beam epitaxy (MBE) deposition techniques. The wafer structure 13 comprises a first distributed Bragg reflector (DBR) region 15, a gain medium 16, a carrier confinement potential barrier 17 and an oxidation prevention layer 18.

As is appreciated by those skilled in the art, there are many variations of the wafer structures 13 incorporated within SDLs and the present invention is not limited to use with any particular DBR 15 or gain medium 16 structure. In general, the gain medium 16 will comprise multiple quantum wells equally spaced between half-wave structures that allow the SDL 5 to be optically pumped at a convenient pump wavelength while the DBR 15 generally comprise multiple pairs of quarter-wave layers that exhibit high reflectivities at the desired wavelength for the output field 12.

By way of example only, the presently described embodiments comprise a gain medium 16 comprising InGaAs quantum wells equally spaced between half-wave GaAs structures that allow the SDL 5 to be optically pumped at 808 nm while generating an output at 980 nm. With the above arrangement the gain medium 16 forms a Resonant Periodic Gain Etalon (RPG) feature 34 exhibiting a free spectral range (FSR) of the order of 30 nm. Further detail of the significance of this feature is discussed below with reference to FIG. 7.

The first DBR region 15 comprises thirty pairs of AlAs— GaAs quarter-wave layers that produce a reflectivity greater than 99.9% centred at 980 nm. The carrier confinement potential barrier 17 comprises a single wavelength-thick $Al_{0.3}Ga_{0.7}As$ layer. The oxidation prevention layer 18 may comprise a thin GaAs cap.

Alternative gain mediums known to those skilled in the art that may alternatively be used include alternative gallium arsenide (GaAs) structures capable of generating output wavelengths between 670 nm and 1300 nm; Indium Phosphide (InP) structures capable of generating output wavelengths between 1350 nm and 1600 nm; and Gallium Antimonide (GaSb) structures capable of generating output wavelengths between 1800 nm and 2700 nm. These gain mediums may be based on quantum wells or quantum dots as known to those skilled in the art.

Figure 3:
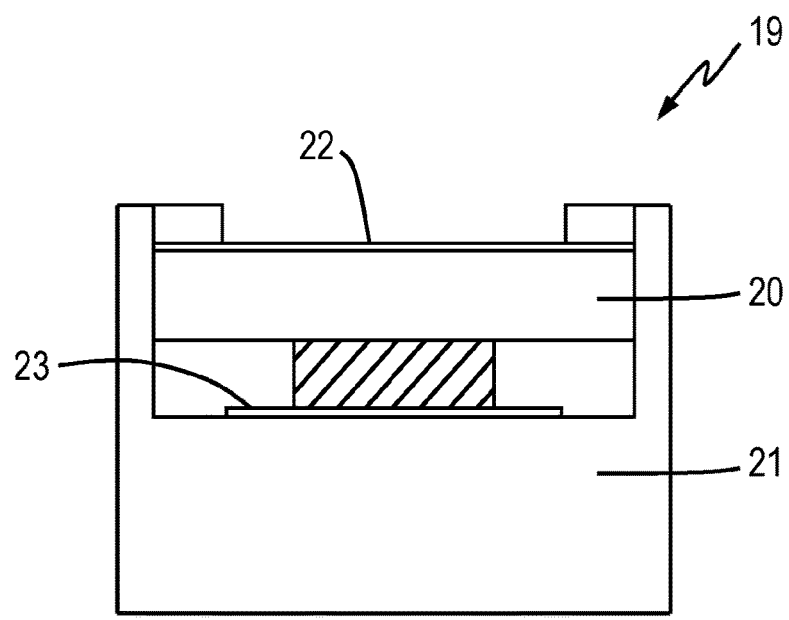
FIG. 3 present a schematic representation of a cooling apparatus employed in conjunction with the SDL of FIG. 2.

FIG. 3 presents further detail of a cooling apparatus 19 employed in order to improve the operating characteristics of the SDL 5. In particular, the cooling apparatus 19 comprises a heat spreader 20 and a standard thermoelectric or water cooler 21. The heat spreader 20 comprises a single diamond crystal that comprises an external, wedged face 22. A high performance anti-reflection coating may be deposited on the surface of the wedged face 22.

The single diamond crystal heat spreader 20 is bonded by optical contacting with the wafer structure 13 so that the gain medium 16 is located between the heat spreader 20 and the first DBR 15. The wafer structure 13 and heat spreader 20 are then fixed on top of a layer of indium foil 23 onto the thermoelectric or water cooler 21.

Figure 4:
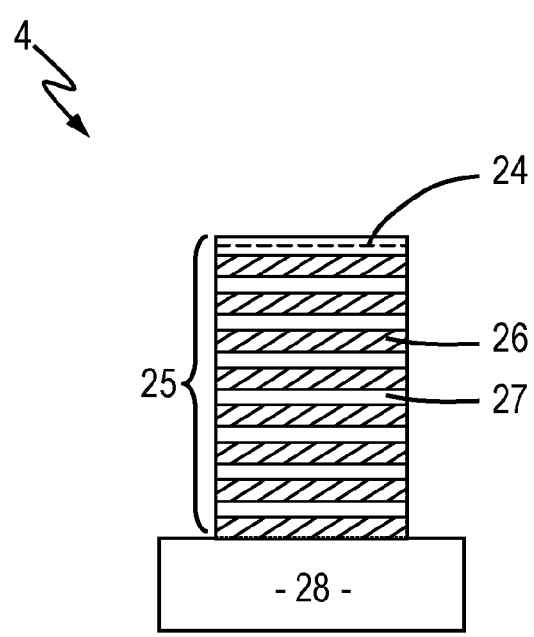
FIG. 4 presents a schematic representation of a saturable Bragg reflector (SBR) employed by the laser of FIG. 1.

Mirror 4 is an intensity saturable mirror and may comprise a saturable Bragg reflector (SBR) of the type described in detail within U.S. Pat. No. 5,627,854 and presented schematically in FIG. 4. In the presently described embodiment this component comprises a single quantum well 24 grown within a second distributed Bragg reflector (DBR) 25. The second DBR 25 can be seen to comprise eight pairs of AlAs 26 AlGaAs 27 quarter-wave layers mounted on a GaAs substrate 28 so as to produce a reflectivity greater than 99.9% over a reflectivity bandwidth ΔR of around 100 nm centred at 950 nm. With the above arrangement the free spectral range of (FSR) of the second distributed Bragg reflector (DBR) 25 is of the order of 300 nm.

As will be appreciated by those skilled in the art, temperature control of the intensity saturable mirror 4 is also necessary. This can be achieved by employing a standard thermoelectric or water cooler in a similar manner to that described above in relation to the SDL 5.

Self mode-locking of the laser 1 can be achieved by employing the following two mechanisms, either independently or in combination.

Figure 5:
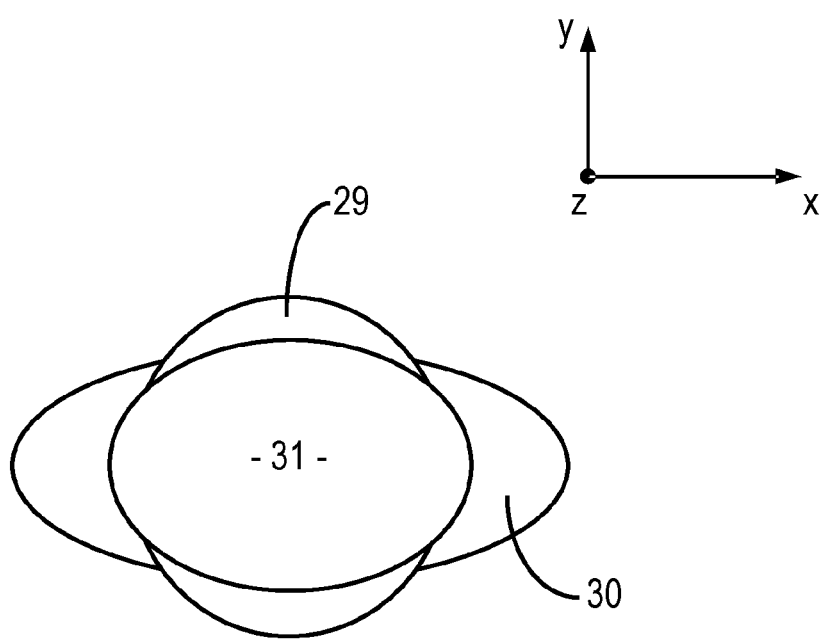
FIG. 5 presents a schematic representation of a cavity mode, a pump spot and a Kerr Lens mode at the surface of the SDL of FIG. 1.

The first mechanism resides in the fact that single diamond crystal is a material that exhibits an inherent optical Kerr effect. This effect can be exploited in order to configure the SDL 5 so as to operate as a self mode locking system, as will now be described in further detail with reference to FIG. 5. In particular, FIG. 5 presents a schematic representation of a cavity mode 29, a pump spot 30 and a Kerr Lens mode 31 at the surface of the SDL 5 of FIG. 1. The resonator 2 is configured such there is an overlap of the area of the cavity mode 29, the pump spot 30 and the Kerr Lens mode 31 at the surface of the SDL 5.

The area of the Kerr lens mode 31 at the SDL 5 is defined by the single diamond crystal heat spreader 20 and in the presently described embodiment it exhibits an elliptical profile with its major axis orientated along the x-axis. In a similar manner the pump spot 30 at the SDL 5 is configured to have an elliptical profile with its major axis also orientated along the x-axis. The major axis of the Kerr lens mode 31 in the presently described embodiment is smaller than the major axis of the pump spot 30.

The concave folding mirror 6 is arranged so as to introduce astigmatism to the cavity mode 29. This is achieved by rotating the concave folding mirror 6 about the y-axis so as to increase the angle of incidence of the resonating field 11 upon this mirror 6. As can be seen from FIG. 5, this rotation results in the cavity mode 29 at the SDL 5 having an elliptical profile with its major axis orientated along the y-axis.

In this configuration the semiconductor laser 1 begins to lase when the gain medium 16 is pumped by the pumping field 9 and the output field 12 is thus generated. The introduction of the astigmatism to the cavity mode 29 at the surface of the SDL 5 means that once the Kerr lensing effect of the heat spreader 20 commences the major axis of the cavity mode 29 is effectively reduced thus causing a greater overlap between the area of the cavity mode 29 and the pump spot 30. Thus, the Kerr lensing effect of the heat spreader 20 can be employed to overcome the induced astigmatism and so provides a first mechanism for self mode locking of the output field 12.

The second mechanism is inherently connected with the length of the resonator 2. By setting the length of the resonator 2 such that the round trip time of the cavity modes corresponds to the upper-state lifetime of the semiconductor carriers located within the gain medium 16 a small perturbation on the intensity of the output field 12 is introduced which is sufficient for the inherent optical Kerr effect of the single diamond crystal heat spreader 20 to induce mode locking on the output field 12. In the presently described embodiment the lifetime of the semiconductor carries is around 5 ns, giving the resonator a length of around 750 mm and a repetition rate of around 200 MHz.

The employment of the intensity saturable mirror 4 in place of a standard flat mirror provides a number of operational improvements to the laser 1. In the first instance, since this mirror 4 is intensity saturable it acts to clip the leading edges of the intracavity pulses or cavity modes that form the resonator field 11. The effect of gain saturation within the gain medium 16 similarly acts to clip the trailing edge of these intracavity pulses or cavity modes. The presence of the intensity saturable mirror 4 therefore provides a means for shorting the pulse widths generated by the laser 1 when compared with those systems known in the art. A self mode-locking output SDL 1 having pulse widths in the range of 100 ps to 100 fs have been demonstrated by the inventors.

The use of the intensity saturable mirror 4 also provides an output 12 that exhibits less noise and is significantly more stable than those systems known in the art which will now be explained in further detail.

Figure 6:
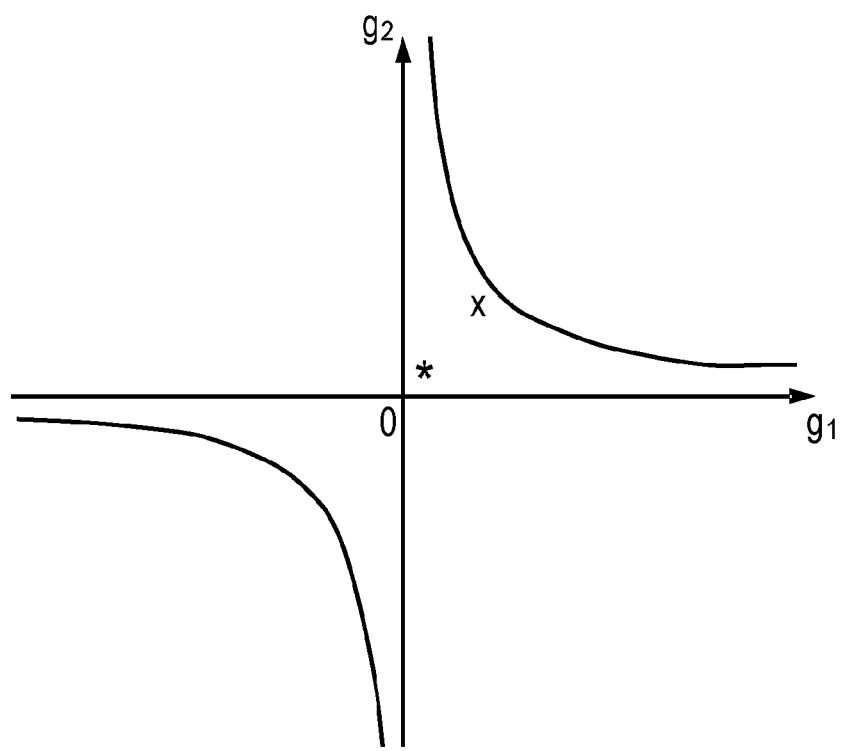
FIG. 6 presents a stability diagram for the laser of FIG. 1.

With reference to the stability diagram of FIG. 6 an "x" marks the calculated stability position for the resonator 2 as shown in FIG. 1 where the second mirror 4 is truly planar. However, somewhat surprisingly the inventors have discovered that the stability position for the laser 1 (marked with a "*" in FIG. 6) is closer to the origin than the theoretically calculated value i.e. the resonator 2 is more stable than originally theoretically predicted. The reason for this surprising increase in the stability of the resonator 2 resides in the fact that the second DBR 25 provides the intensity saturable mirror 4 with a slightly convex outer surface profile rather than a truly planer surface profile.

Figure 7:
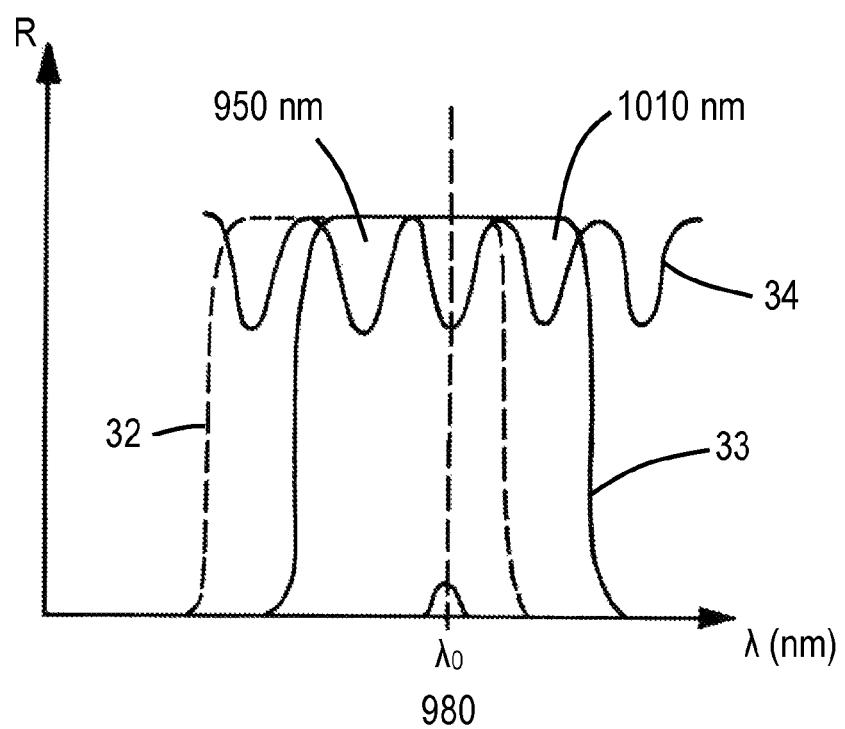
FIG. 7 presents a schematic representation of reflectivity and gain profiles for the mode-locked semiconductor disc lasers (SDL) of FIG. 1.

A further reduction of noise instability of the laser 1 is achieved as a result of the fact that there exists a wavelength mismatch between the reflectivity profile 32 of the second distributed Bragg reflector (DBR) 25 contained within intensity saturable mirror 4 and the reflectivity profile 33 of the first DBR 15 of the SDL 5, as depicted schematically in FIG. 7. FIG. 7 also presents a schematic representation of the Resonate Periodic Gain etalon feature (RPG feature) depicted by the reference numeral 34.

Normal practice in the art is to design resonators having the reflectivity profiles of the various mirrors centred about a preferred wavelength e.g. $\lambda_0=980$ nm. However, the inventors have found that such resonators suffer from noise instabilities. Investigations suggest that these noise instabilities are a result of gain competition between the gain of the RPG feature corresponding to the central wavelength $\lambda_0$ and those of the RPG features at longer wavelengths e.g. 1010 nm. Indeed, in the absence of this wavelength mismatch, the inventors have somewhat surprisingly even observed mode-locked output at 1010 nm corresponding to the next, longer wavelength, lower energy RPG feature. These instabilities and uncertainties in the operating wavelength of a mode locked SDL are obviously highly problematic to the development and production of any commercial laser system.

As will be appreciated by the skilled reader, in the presently described embodiment the reflectivity profile 32 of the second distributed Bragg reflector (DBR) 25 has been shifted to a shorter wavelength by 30 nm, an amount corresponding to one free spectral range of the resonant periodic gain etalon (RPG) feature 34. The effect of this mismatch is to introduce a controlled loss into the resonator 2. This controlled loss is found to be sufficient to suppress gain at the longer wavelength corresponding to the lower energy RPG feature (i.e. the 1010 nm RPG feature) but not of such a level to prevent self starting mode locking within the RPG feature coinciding with the central wavelength $\lambda_0$ at 980 nm.

Furthermore, even when the reflectivity of the second distributed Bragg reflector (DBR) 25 is centred at 950 nm there remains insufficient gain within the shorter wavelength, higher energy, RPG feature (i.e. the 950 nm RPG feature) to disrupt the mode locking of the 980 nm output field 12. The reason for this resides in the fact that there is a tendency within an SDL for the carries to congregate at lower energies, and thus emit light at the corresponding longer wavelengths.

The overall result of reducing the reflectivity within the resonator for the central wavelength $\lambda_0$ by introducing a mismatch between the reflectivity profiles of the second DBR region 25 and that of the first DBR region 15 is that the output field 12 of the laser 1 reliably mode locks at the desired central wavelength $\lambda_0$ of 980 nm with significantly improved noise characteristics.

Sufficient loss on the gain at the longer wavelength corresponding to the lower energy, RPG feature (i.e. the 1010 nm RPG feature) is still found to be present when the reflectivity profile 32 of the second DBR region 25 is shifted to a shorter wavelength by only 15 nm, an amount corresponding to a half of the free spectral range of the resonant periodic gain etalon (RPG) feature.

As a result of the combination of the above features a self mode locking laser is provided that generates a low noise, ultra short output field at 980 nm i.e. pulse widths below in the range of 100 ps to 100 fs can be generated. This result is highly repeatable and the mode locking takes place without any requirement for further input from the operator of the laser 1. Furthermore, the laser 1 operates stably on the $TEM_{00}$ transverse electromagnetic modes for long periods of time. As a result the inventors have been able to produce a commercially viable intensity saturable mirror based self mode locking SDL.

It will be appreciated that a number of alternatives may be incorporated into the above described embodiments. For example the structure of the SDL 5 may be varied so as to provided alternative output wavelengths as required by the particular application for which the semiconductor laser is to be employed.

Furthermore, the orientations of the cavity mode 29, the pump spot 30 and the Kerr Lens mode 31 may be varied such that that the angles between the associated major axes vary from the particular described embodiment. What is important is that the resonator is configured such that an astigmatism introduced to the cavity mode 29 by the configuration of the resonator 2 is reduced by the optical Kerr effect induced by the heat spreader 20 when the gain medium 16 is pumped by the pumping field 9 such that the overlap area between the cavity mode 29 and the pump spot 30 is increased.

The heat spreader may alternatively comprise materials other than single diamond crystal as long as the material employed exhibits the required heat spreading and optical Kerr lensing properties. Sapphire ($Al_2O_3$) and silicon carbide (SiC) are examples of alternative materials that may be employed to produce the heat spreader.

The presently described semiconductor laser systems can therefore be employed to generate a pulsed output field having a pulse widths from 100 ps down to 100 fs, at wavelengths between 670 nm and 2700 nm and with power outputs ranging from 100 mW to 5 W.

A self mode locking laser and corresponding method is described. The laser comprises a resonator terminated by first and second mirrors and folded by a third mirror. The third mirror comprises a reflector surmounted by a multilayer semiconductor gain medium that includes at least one quantum well layer and an optical Kerr lensing layer. A perturbator is also included that provides a means to induce a perturbation on an intensity of one or more cavity modes of the resonator. The pertubator is employed to induce a small perturbation on the intensity of the cavity modes of the resonator which is sufficient for the optical Kerr lensing layer to induce mode locking on the output field. The second mirror comprises an intensity saturable mirror that provides a means for reducing the pulse widths of the generated output field e.g. to around 100 fs.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers.

Furthermore, reference to any prior art in the description should not be taken as an indication that the prior art forms part of the common general knowledge.

The foregoing description of the invention has been presented for purposes of illustration and description and is not intended to be exhaustive or to limit the invention to the precise form disclosed. The described embodiments were chosen and described in order to best explain the principles of the invention and its practical application to thereby enable others skilled in the art to best utilise the invention in various embodiments and with various modifications as are suited to the particular use contemplated. Therefore, further modifications or improvements may be incorporated without departing from the scope of the invention as defined by the appended claims.

The invention claimed is:

1. A self mode locking laser comprising:
    a resonator terminated by first and second mirrors and folded by a third mirror, the third mirror comprising a reflector surmounted by a multilayer semiconductor gain medium including at least one quantum well layer and an optical Kerr lensing layer,
    a perturbator induces a perturbation on an intensity of one or more cavity modes of the resonator causing the optical Kerr lensing layer to induce mode locking on an output field of the resonator without the use of a saturable absorber,
    wherein the second mirror comprises an intensity saturable mirror that reduces the pulse widths of the mode-locked output field.

2. The self mode locking laser as claimed in claim 1 wherein the pertubator comprises an astigmatism controller that introduces astigmatism to the one or more cavity modes at the gain medium.

3. The self mode locking laser as claimed in claim 2 wherein the resonator is configured so the Kerr lensing layer acts to compensate for the astigmatism introduced to the one or more cavity modes.

4. The self mode locking laser as claimed in claim 1 wherein the pertubator comprises a length of the resonator being selected so a round trip time of the cavity modes is substantially equal to an upper-state lifetime of one or more semiconductor carriers located within the gain medium.

5. The self mode locking laser as claimed in claim 1 wherein the optical Kerr lensing layer comprises a heat spreader mounted upon the semiconductor gain medium.

6. The self mode locking laser as claimed in claim 1 wherein the optical Kerr lensing layer comprises a layer of diamond crystal.

7. The self mode locking laser as claimed in claim 1 wherein the resonator is folded by a fourth mirror, the fourth mirror being located along an optical path between the second and third mirrors.

8. The self mode locking laser as claimed in claim 7 wherein the fourth mirror has a concave radius of curvature.

9. The self mode locking laser as claimed in claim 7 wherein the resonator is folded by a fifth mirror, the fifth mirror being located along an optical path between the second and fourth mirrors.

10. The self mode locking laser as claimed in claim 9 wherein the fifth mirror is planar.

11. The self mode locking laser as claimed in claim 9 wherein the resonator is folded by a sixth mirror, the sixth mirror being located along an optical path between the second and fifth mirrors.

12. The self mode locking laser as claimed in claim 11 wherein the sixth mirror has a concave radius of curvature.

13. The self mode locking laser as claimed in claim 1 wherein the laser comprises a continuous wave (cw) optical field source the output from which is configured to pump the gain medium.

14. The self mode locking laser as claimed in claim 7 wherein the astigmatism controller comprises a mirror rotating mechanism.

15. The self mode locking laser as claimed in claim 14 wherein the mirror rotating means is employed to rotate the fourth mirror so as to vary the angle of incidence of the cavity modes upon the fourth mirror.

16. The self mode locking laser as claimed in claim 1 wherein the gain medium is configured to generate the one or more cavity modes at a predetermined wavelength $\lambda_o$ within a first resonant periodic gain etalon (RPG) feature.

17. The self mode locking laser as claimed in claim 1 wherein the first mirror is partially reflective and partially transmissive at the predetermined wavelength $\lambda_o$.

18. The self mode locking laser as claimed in claim 16 wherein the reflectivity profile of the second mirror is offset to a wavelength shorter than the predetermined wavelength $\lambda_o$ and configured to suppress gain within a second resonant periodic gain etalon (RPG) feature at a wavelength longer than the predetermined wavelength $\lambda_o$.

19. The self mode locking laser as claimed in claim 18 wherein a central wavelength of the reflectivity profile of the second mirror is offset to a wavelength that is in the range of a half to one free spectral range of the resonant periodic gain etalon (RPG) feature.

20. The self mode locking laser as claimed in claim 1 wherein the reflector comprises a first distributed Bragg reflector (DBR).

21. The self mode locking laser as claimed in claim 1 wherein the intensity saturable mirror comprises a saturable Bragg reflector (SBR) having a second distributed Bragg reflector (DBR) and one or more quantum well layers located within the second distributed Bragg reflector (DBR).

22. The self mode locking laser as claimed in claim 1 wherein the laser provides an output field comprising ultra short pulses.

23. The self mode locking laser as claimed in claim 22 wherein the ultra short pulses have a pulse width below 100 fs.

24. A method of self mode locking a laser the method comprising:
providing a resonator terminated by a first mirror and a second mirror, the second mirror comprising an intensity saturable mirror;
folding the resonator with a third mirror, the third mirror comprising a reflector surmounted by a multilayer semiconductor gain medium including at least one quantum well layer and an optical Kerr lensing layer;
inducing a perturbation on an intensity of one or more cavity modes of the resonator causing the optical Kerr lensing layer to induce mode locking on an output field of the resonator without the use of a saturable absorber; and
employing the intensity saturable mirror to reduce the pulse widths of the output optical field of the resonator.

25. The method of self mode locking a laser as claimed in claim 24 wherein inducing the perturbation on the intensity of the intracavity field of the resonator comprises introducing an astigmatism to the one or more cavity modes at the gain medium.

26. The method of self mode locking a laser as claimed in claim 25 wherein the method further comprises configuring the resonator so the Kerr lensing layer acts to compensate for the astigmatism introduced to the cavity modes.

27. The method of self mode locking a laser as claimed in claim 24 wherein inducing the perturbation on the intensity of the one or more cavity modes of the resonator comprises selecting a length of the resonator so a round trip time of the one or more cavity modes is substantially equal to an upper-state lifetime of one or more semiconductor carriers located within the gain medium.

28. The method of self mode locking a laser as claimed in claim 24 wherein the method further comprises folding the cavity by providing a fourth mirror located along an optical path between the second and third mirrors.

29. The method of self mode locking a laser as claimed in claim 28 wherein the astigmatism is introduced to the cavity mode by rotating the fourth mirror so as to increase the angle of incidence of a resonating field upon the fourth mirror.

30. The method of self mode locking a laser as claimed in claim 28 wherein the method further comprises folding the cavity by providing a fifth mirror located along an optical path between the second and fourth mirrors.

31. The method of self mode locking a laser as claimed in claim 30 wherein the method further comprises folding the cavity by providing a sixth mirror located along an optical path between the second and fifth mirrors.

32. The method of self mode locking a laser as claimed in claim 24 wherein the method further comprises providing a continuous wave (cw) optical field configured to pump the gain medium.

33. The method of self mode locking a laser as claimed in claim 24 wherein the method further comprises configuring the gain medium to generate the one or more cavity modes at a predetermined wavelength $\lambda_0$ within a first resonant periodic gain etalon (RPG) feature.

34. The method of self mode locking a laser as claimed in claim 33 wherein the method further comprises offsetting the reflectivity profiles of the second mirror to a wavelength shorter than the predetermined wavelength $\lambda_0$.

35. The method of self mode locking a laser as claimed in claim 34 wherein the method further comprises configuring the reflectivity profiles of the second mirror to suppress gain within a second resonant periodic gain etalon (RPG) feature at a wavelength longer than the predetermined wavelength $\lambda_0$.

36. The method of self mode locking a laser as claimed in claim 34 wherein a central wavelength of the reflectivity profile of the second mirror is offset to a wavelength that is in the range of a half to one free spectral range of the resonant periodic gain etalon (RPG) feature.

37. A self mode locking laser comprising:
a resonator terminated by first and second mirrors and folded by a third mirror, the third mirror comprising a reflector surmounted by a multilayer semiconductor gain medium including at least one quantum well layer and an optical Kerr lensing layer,
an astigmatism controller to induce a perturbation on an intensity of one or more cavity modes of the resonator causing the optical Kerr lensing layer to induce mode locking on an output field of the resonator without the use of a saturable absorber,
wherein the second mirror comprises an intensity saturable mirror that reduces the pulse widths of the mode-locked output field.

38. A self mode locking laser comprising:
a resonator terminated by first and second mirrors and folded by a third mirror, the third mirror comprising a reflector surmounted by a multilayer semiconductor gain medium including at least one quantum well layer and an optical Kerr lensing layer,
wherein a length of the resonator is selected so a round trip time of the cavity modes is substantially equal to an upper-state lifetime of one or more semiconductor carriers located within the gain medium, to induce a perturbation of an intensity of an output field of the resonator causing the optical Kerr lensing layer to induce mode locking on the output field of the resonator without the use of a saturable absorber, and
wherein the second mirror comprises an intensity saturable mirror that reduces the pulse widths of the mode-locked output field.

* * * * *